United States Patent [19]

Burr et al.

[11] Patent Number: 5,565,788
[45] Date of Patent: Oct. 15, 1996

[54] COAXIAL WAFER PROBE WITH TIP SHIELDING

[75] Inventors: Jeremy Burr; Gregory Nordgren; Eric W. Strid; Kimberly R. Gleason, all of Portland, Oreg.

[73] Assignee: Cascade Microtech, Inc., Beaverton, Oreg.

[21] Appl. No.: 439,993

[22] Filed: May 12, 1995

Related U.S. Application Data

[63] Continuation-in-part of Ser. No. 277,835, Jul. 20, 1994, Pat. No. 5,506,515.

[51] Int. Cl.$^6$ ..................................................... G01R 31/02
[52] U.S. Cl. ............................................. 324/762; 324/754
[58] Field of Search ......................................... 324/762, 754

[56] References Cited

U.S. PATENT DOCUMENTS

| | | | |
|---|---|---|---|
| 4,697,143 | 9/1987 | Lockwood et al. | 324/754 |
| 4,894,612 | 1/1990 | Drake et al. | 324/761 |
| 5,373,231 | 12/1994 | Boll et al. | 324/158.1 |

*Primary Examiner*—Kenneth A. Wieder
*Assistant Examiner*—Kourosh Cyrus Khosravi
*Attorney, Agent, or Firm*—Chernoff, Vilhauer, McClung & Stenzel

[57] ABSTRACT

A shielded microwave probe tip assembly includes an end of a coaxial cable coupled to probe fingers forming a coplanar controlled impedance microwave transmission line where the ground probe fingers are interconnected by a shield member that is spaced apart from the signal line probe finger but is positioned between the signal line probe finger and a device under test. The shield prevents the generation of extraneous signals or parasitic coupling from the device under test which would otherwise degrade measurement accuracy.

4 Claims, 3 Drawing Sheets

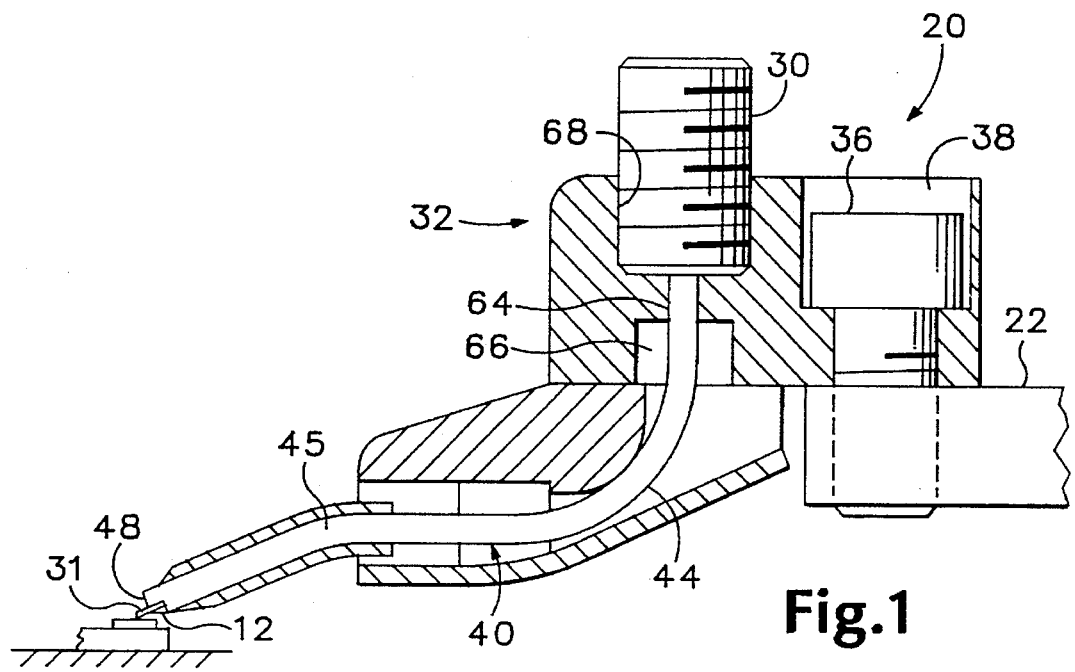
Fig.1
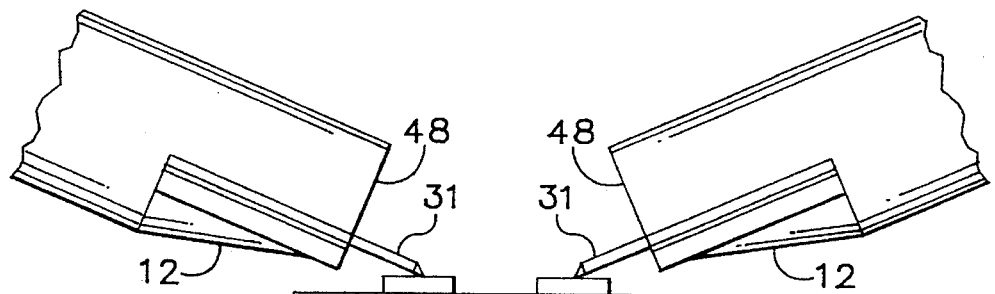
Fig.2
Fig.2A
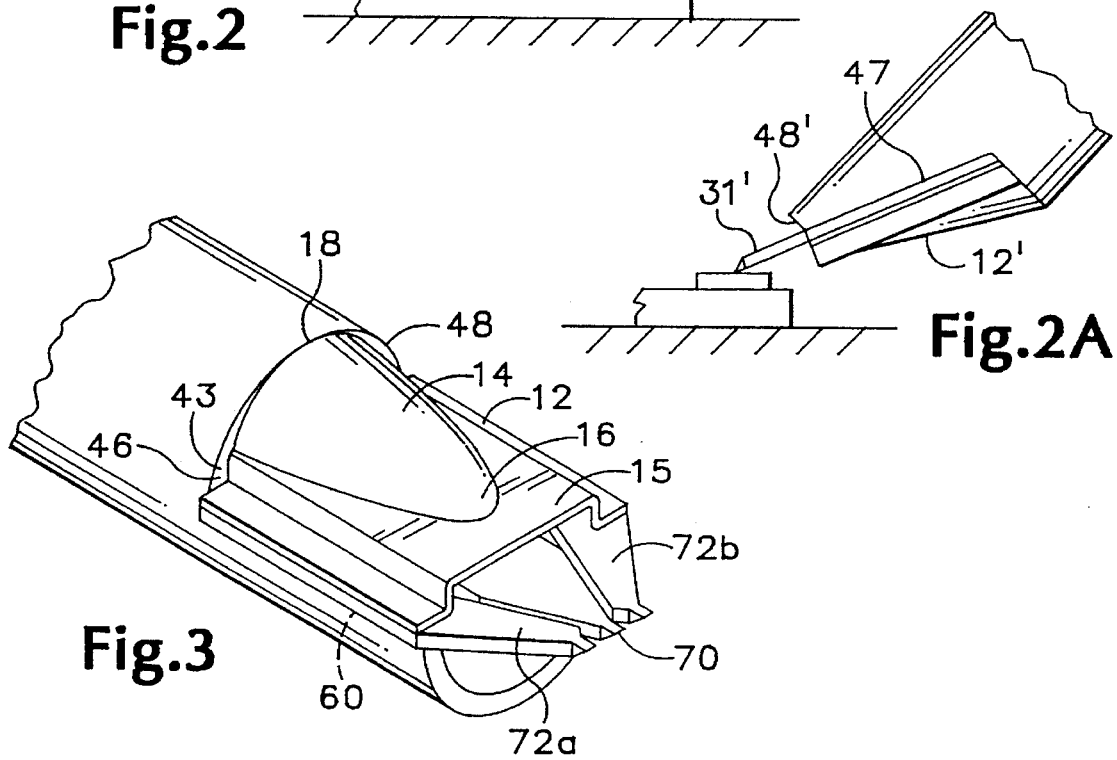
Fig.3

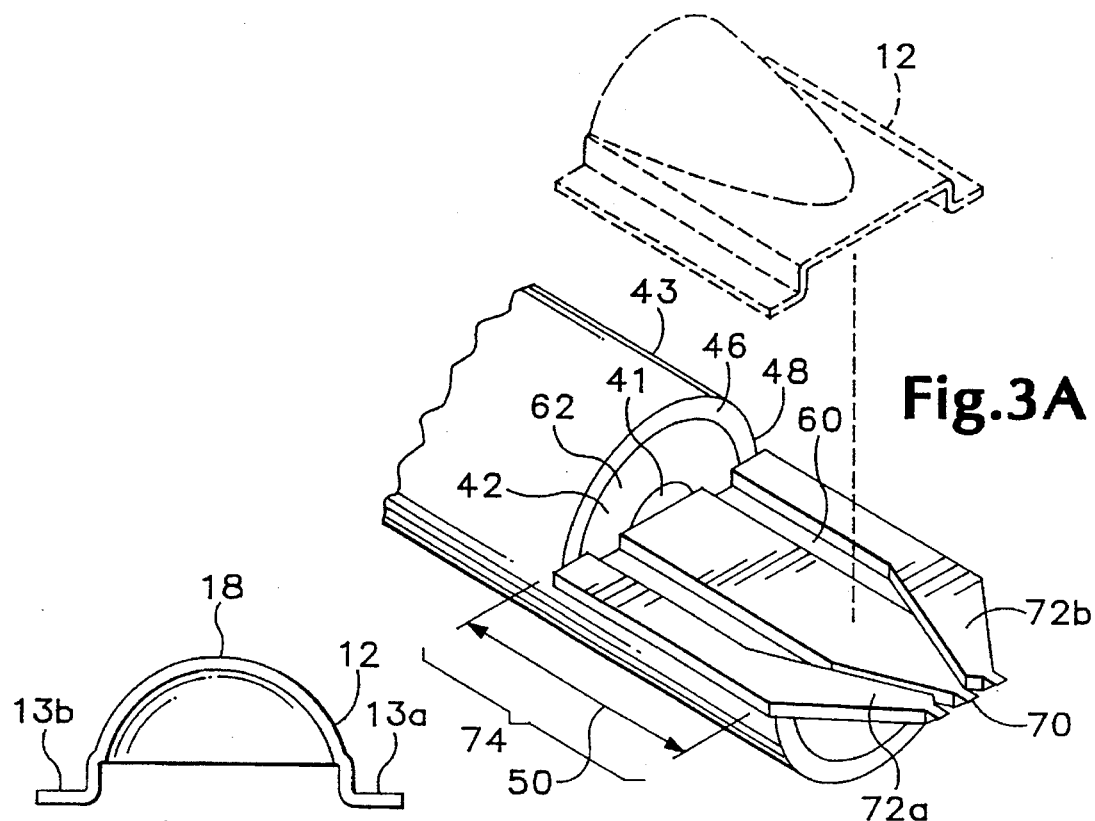
Fig.3A
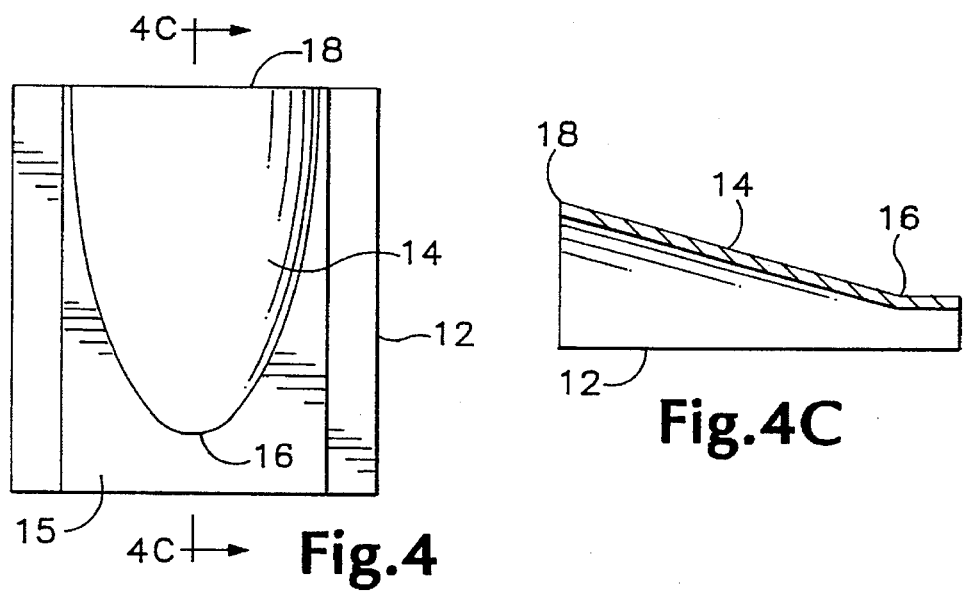
Fig.4A
Fig.4C
Fig.4
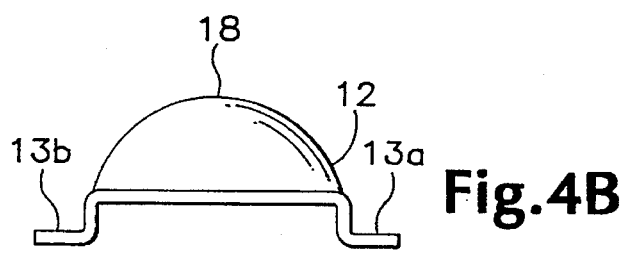
Fig.4B

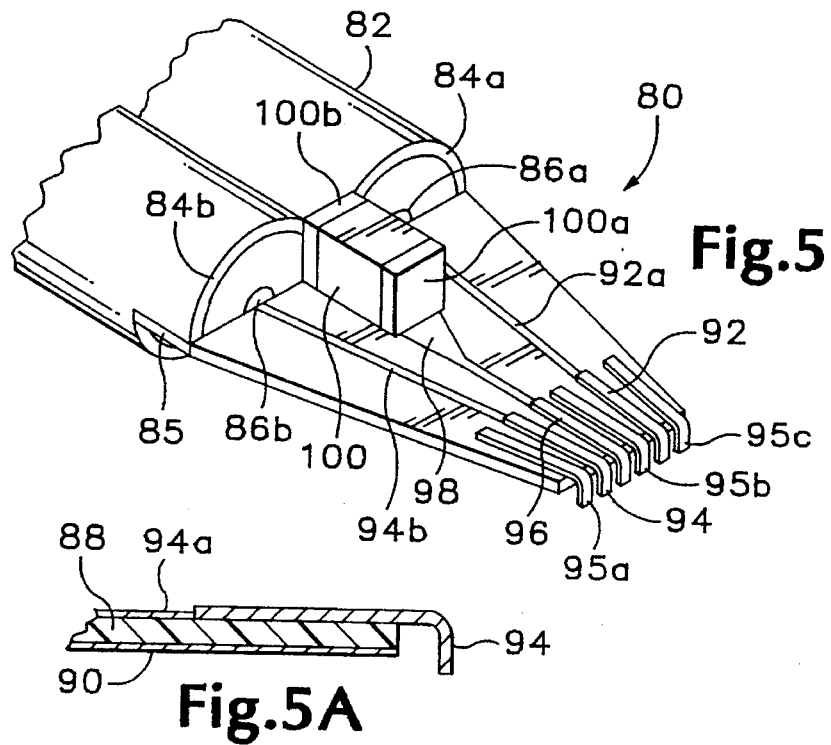
Fig.5
Fig.5A
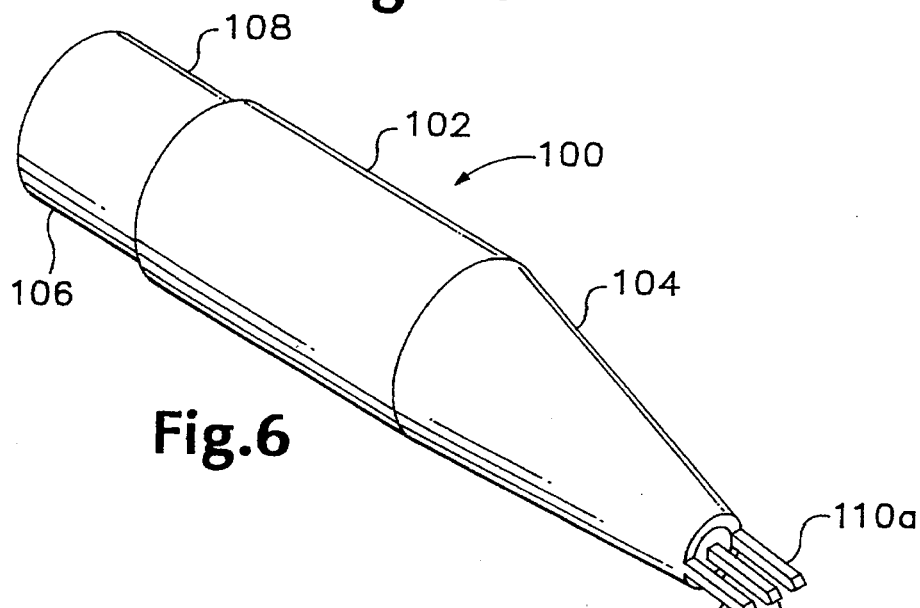
Fig.6
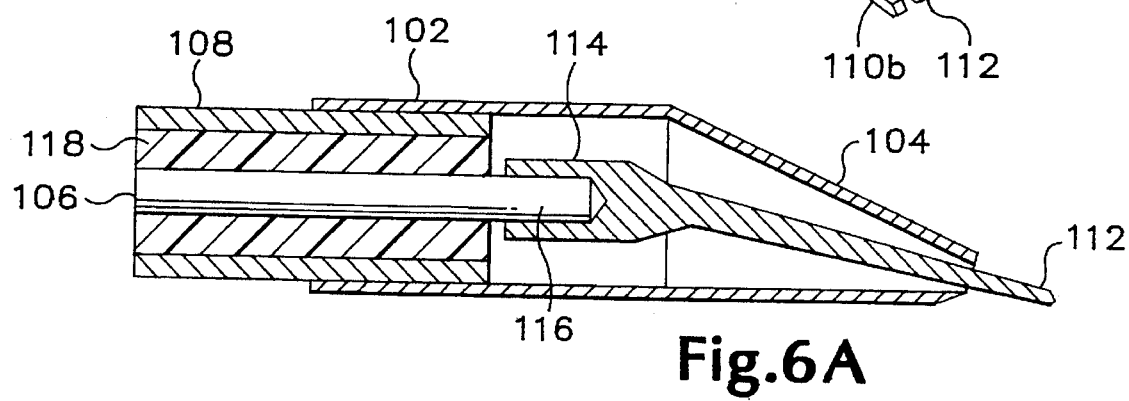
Fig.6A

COAXIAL WAFER PROBE WITH TIP SHIELDING

BACKGROUND OF THE INVENTION

This application is a continuation-in-part of application Ser. No. 08/277,835 entitled HIGH FREQUENCY PROBE TIP ASSEMBLY filed on Jul. 20, 1994, now U.S. Pat. No. 5,506,515 and assigned to the same assignee as the application herein. The specification of that application is incorporated herein by reference.

This invention relates to a high frequency probe tip assembly and more particularly to a shield for such probe tip assemblies to prevent electromagnetic interference from degrading the measurement accuracy of microwave probes at very high frequencies. Microwave probes of the type described in the above-identified patent application provide microwave probes operable at microwave frequencies extending into the gigahertz range that are capable of providing a transmission channel of well-defined impedance for the low loss transfer of signals to and from the contact pads of a device under test. Such probes are highly compliant and capable of contacting even nonplanar surfaces of a device under test (DUT) and are sufficiently rugged to withstand repeated use in a high volume production environment. Near the tip of a microwave probe, however, the contact conductors parasitically couple to other conductors or dielectrics on the DUT or impedance standard substrate (ISS). Such coupling causes measurement inaccuracies due to the portion of the microwave energy that is propagated away from the other conductors or dielectrics and ultimately reflected back, absorbed or radiated. Since this energy is not accounted for in calibrations, any such energy causes measurement errors.

Some probes such as ceramic probes attempt to confine electrical fields by fabricating the conductors on a relatively high dielectric constant substrate, typically alumina. This results in most of the electric field being confined in the substrate and not present in the air gap between the probe tip and the DUT. This achieves excellent electrical results but suffers from low mechanical compliance between the contact conductors due to the rigid ceramic backing.

Other probe tips use 20 mil diameter coaxial cable with contact conductors about 20 mils long extending from the end of the cable. The small dimensions result in limited coupling to the DUT but coupling is higher than with a typical wafer probe of the type described above, especially above 50 Ghz or with ground signal tip configurations. Additionally, the 20 mil coax causes higher loss than larger coax diameters. The 20 mil tips also cause a lower limit on the common lead inductances possible in a multisignal contact configuration.

SUMMARY OF THE INVENTION

The present invention provides a construction for a high frequency microwave probe tip assembly that shields the probe tips from the unwanted effects of electromagnetic fields that couple into the probe tips from the DUT. A shielded microwave probe tip assembly constructed according to the invention includes a supporting section of electromagnetic line including an inner conductor coaxially surrounded by an outer conductor and a tip section of electromagnetic line having a top side and a bottom side and including a signal conductor and one or more ground conductors generally arranged normally in parallel relationship to each other along a common plane so as to form a controlled impedance structure. The supporting section and the tip section are joined at a transition of the electromagnetic line so that the inner conductor is connected to the signal conductor and the outer conductor is connected to the pair of ground conductors. A shield member interconnected to the ground conductors covers at least a portion of the signal conductor on the bottom side of the tip section. The signal conductor and the ground conductors each have an end portion and the end portions are able to resiliently flex, despite the presence of the shielding member, relative to each other and away from their common plane so as to permit probing of a DUT having nonplanar surfaces.

The metallic shield may be coupled to outside edges of ground plane conductive fingers and may include a cylindrical tapered portion having an end in contiguous contact with the outer conductor over at least a portion of its circumference, tapering to a tip adjacent the forward end of the shield near the tips of the conductive fingers. The end of the shield extends as close as possible to the tips of the conductive fingers while the taper allows a relatively flat contact angle between the probe and the DUT.

In another aspect of the invention this shield comprises a substantially cylindrical member coupled to an outer metallic ground conductor of a coaxial cable. The metallic cylindrical member may be tapered so that a conical tip is formed with an opening for a signal line conductive probe finger. The end of the tapered conical shield may include integral finger-like extensions and the signal line finger may be coupled to the inner conductor of the coaxial cable and extend through the opening in the conical shield to form a coplanar controlled impedance structure for contacting the pads of a device under test. The metallic outer shield substantially surrounds the cantilevered signal line finger which is coupled to the inner conductor of the coaxial cable. The finger may have a socket which may be press fitted onto an exposed end of the inner conductor.

In yet another aspect of the invention, a microstrip transmission line may be provided with a metallic shield. According to this embodiment of the invention, a single or dual coaxial cable includes a dielectric substrate placed on the underside of a cutout shelf portion of the cable. A signal line extends along the top side of the dielectric substrate connecting a probe finger with each inner conductor. A metallic shield may be affixed to the underside of the dielectric substrate and is electrically coupled to the outer metallic conductor on both sides of the coaxial cable. Ground-connected fingers are placed adjacent the signal line conductors and are connected to the metallic shield by way of vias through the dielectric substrate. In addition, a power line finger may be provided and coupled to ground through a filter capacitor placed on the top side of the dielectric material and coupled to the outer ground conductors of the coaxial cable.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 1 is a longitudinal sectional view of the wafer probe of the invention mounted on a probe-supporting member and just after contact has been made between the probing end of the probe and a device under test.

FIG. 2 is a side schematic view of a pair of probe tips contacting different test points on a device under test.

FIG. 2A is a side schematic view of one of the probes of FIG. 2 modified to provide an obliquely angled shelf for supporting a shielded probe.

FIG. 3 is a perspective view of a probe tip viewed from underneath the probe and employing the probe tip shield of the present invention.

FIG. 3A is a bottom perspective view of the probe of FIG. 3 with the shield removed and shown in dashed outline.

FIG. 4 is a top view of the shield member shown in FIG. 3.

FIG. 4A is a rear view of the shield of FIG. 4.

FIG. 4B is a front view of the shield of FIG. 4.

FIG. 4C is a sectional view taken along line C—C of the probe tip shield of FIG. 4.

FIG. 5 is a partial perspective view of an embodiment of the invention adapted for use with a microstrip transmission line structure.

FIG. 5A is a partial side cutaway view of the transmission line structure of FIG. 5.

FIG. 6 is a perspective view of a probe tip assembly employing a cylindrical tapered shield having integrally formed ground probe tip fingers.

FIG. 6A is a side cutaway view of the probe tip assembly of FIG. 6.

DETAILED DESCRIPTION OF THE PREFERRED EMBODIMENT

With respect to its overall construction, the wafer probe 20 includes a primary support block 32 which, in the preferred embodiment shown, is made of brass and which is suitably constructed for connection to the probe-supporting member 22. To effect this connection, a round opening (not shown) that is formed on the block is snugly fitted slidably onto an alignment pin (not shown) that upwardly projects from the probe supporting member, and a pair of fastening screws 36 are inserted into a corresponding pair of countersunk openings 38 provided on the block for screwing engagement with the probe-supporting member, each within a respective threaded opening formed on that member.

In the preferred embodiment shown in FIG. 1, a semirigid coaxial cable 40 of 0.047 or 0.031 inch nominal outer diameter and of 1.25 inch nominal length is electrically connected at its rearward end to the K-connector 30. Referring also to FIG. 3A, this coaxial cable includes a copper inner conductor 41, an air-expanded Teflon™ inner dielectric 42 (for maximum temperature stability) and a copper outer conductor 43 and is preferably of phase-stable, low-loss type. One suitable type of cable, for example, is available from Microcoax Components Inc. of Collegeville, Pa. under model number UT47-LL.

Referring to FIGS. 2 and 3A together, the forward end 48 of the cable 40 remains freely suspended and, in this condition, serves as a movable support for the probing end 31 of the probe. Before being connected to the K-connector 30, the cable is bent along first and second intermediate portions 44 and 45 in the manner shown in FIG. 1 so that an upwardly curving 90° bend and a downwardly curving 23° bend, respectively, are formed in the cable. Also prior to its connection to the K-connector, a semicylindrical recess 46 is formed in the cable adjacent its forward end 48 as shown in FIG. 3A. This recess is formed by making a longitudinal cut of about 28 mil depth 50 through the cable and by making a transverse cut of about 21.5 mil depth at the end of the longitudinal cut. In accordance with this procedure, a semi-cylindrical portion of the outer conductor 43, the inner dielectric 42 and the inner conductor 41 are removed, so that the remaining portions of these elements together form a flat shelf 60 that extends to the forward end of the cable as well as a back face 62 that extends crosswise in relation to the length of the cable.

To prepare the rearward end of the cable 40 for connection to the K-connector 30, the rearward end is stripped to expose the adjacent inner conductor, and this inner conductor is temporarily held inside a dummy connector while the adjacent outer conductor is soldered within a bore 64 formed in the primary support block 32. A recess 66 that is formed in the block below this bore provides access to facilitate the soldering process. The dummy connector is then removed and the K-connector 30 is screwably installed in a threaded opening 68 that is formed on the block above the bore so as to effect electrical connection between such connector and the coaxial cable 40. Preferably, Locktite 242™ is applied to the threads of the K-connector prior to its installation to ensure a tight physical connection.

Referring to FIG. 3A, at the probing end 31 of the exemplary probe 20, an inner conductive finger 70 is connected to the inner conductor 41 of the cable and a pair of outer conductive fingers 72a and 72b are connected to the adjacent outer conductor 43 so as to form a ground-signal-ground conductor configuration. Each respective finger includes a cantilevered portion 74 that extends past the forward end 48 of the cable. The cantilevered portions are arranged in transversely spaced apart relationship to each other so as to cooperatively form a controlled impedance transmission line in order that a low loss transition can be made between the respective conductors 41 and 43 on the cable and the respective pads on the device-under test.

Referring to FIG. 3 a shield member 12 is fixed to the outer conductive fingers 72a and 72b, respectively, along a portion of their lateral width. This shield member 12 is bent inwardly from the outer edges of fingers 72a and 72b to provide a clearance for the inner conductor 70. This shield member 12 has a tapered cylindrical portion 14 whose forward end 16 is a tapered tip and whose rear end 18 has a contour that is in continuous contact with the outer coaxial conductor 43 along its circumference so that there is no gap between the outer conductor 43 and portions of the shield 14 that could possibly create fringing fields that could effect probe measurements. A pair of folds 13a and 13b create a 90° angle (refer to FIGS. 4A and 4B) which raises the surface of the shield 15 above (actually below in actual use) the conductive finger 70 to provide clearance for the finger to move upon contact with a device under test. The clearance should be as close as possible, however, and the length of the shield 12 should be such that it is connected along as much of the length of the fingers 72a and 72b as possible so as to provide a maximum shielding effect from the effects of microwave energy coupled into the probe from the DUT or other external devices. This shield reduces parasitic coupling to any external structure and the construction of the shield as a single piece of metal reduces complexity of assembly. This shield is joined to the tips of the conductor 72a and 72b and the regions supported by this shelf 60. As such it is not flexed during probing and is therefore not susceptible to fatigue. The shield 12 is made of a thin foil and is capable of being formed by simple shield fabrication processes. In addition, high temperature solders may be employed along with a solder preform which will increase the joint strength of the solder joint between the shield and each of the ground plane fingers.

A variation of this structure is shown in FIG. 2A where the forward end 48' of coaxial cable has been cut at an oblique angle thus providing a slanted support shelf 47 for the probing end 31'. In all other respects this structure is similar to that shown in FIGS. 3 and 3A. The center conductor is coupled to the underside of the center signal carrying finger and the shield 12' is affixed to the outer probe fingers.

Referring to FIGS. 5 and 5A another embodiment of the invention is shown which employs a microstrip transmission line structure. A microstrip probe tip 80 includes an end of a dual transmission line 82. The dual transmission line 82 includes outer metallic conductors 84a and 84b and inner signal line conductors 86a and 86b. The underside of the cable 82 is cut away to form a flat shelf 85, and a dielectric substrate 88 is affixed to the shelf 85. Referring to FIG. 5A a planar metallic shield 90 is affixed to the bottom of the substrate 88. The metallic shield 90 is coupled on either side of the substrate 88 to the outer conductors 84a and 84b, respectively, to form a ground plane. A plurality of probe tip fingers are mounted on the top side of the substrate 88. Signal probe fingers 92 and 94 are coupled to the inner conductors of the coaxial cable 82 by way of metallic leads 92a and 94a, respectively. Ground probe tip fingers 95a, 95b and 95c are arranged in the same plane adjacent the signal probe tip fingers 92 and 94 to form a microstrip transmission line controlled impedance structure. The ground probe tip fingers 95a, 95b and 95c are connected to the metallic shield 90 by way of vias (not shown) through the dielectric substrate 88. A power tip finger 96 may be used to provide a low impedance, low inductance connection to the power pin on the device under test when testing at high frequencies. As such the power tip finger 96 may be coupled by way of a transmission line lead 98 to a bypass capacitor 100. The bypass capacitor 100 has a metallic forward end 100a coupled to the transmission line 98 and a back end 100b which is coupled to the outer conductors 84a and 84b, respectively. According to this embodiment of the invention, one or more than two coaxial conductors may also be used. If more than two coaxial cables are used, there may be more than one power tip finger and its associated bypass capacitor.

Referring to FIGS. 6 and 6A an embodiment of the invention is shown that employs an outer cone shaped shield. A metallic shield 100 includes a cylindrical portion 102 and a conical tip portion 104. The cylindrical portion 102 is affixed to the end of a coaxial cable 106. The outer part of the coaxial cable 106 is a metal outer conductor 108 and the shield member 100 is therefore electrically connected to ground. Two fingers 110a and 110b are integrally formed from the tip portion 104 to provide a coplanar ground plane for a central cantilevered probe finger 112 which carries the signal. The probe finger 112 has a socket portion 114 which surrounds an exposed extension of the center conductor 116. A cylindrical dielectric material 118 separates the center conductor 116 from the outer ground conductor 108.

The design of FIG. 6 provides a smooth transition between the coaxial cable 106 and the end of the probe tip at fingers 112, 110a and 110b. The tip is completely shielded as it transitions to the tip of the cone portion 104. To form the ground plane fingers 110a and 110b the tip portion of the cone 104 may be cut back to the point where the outer diameter of the cone matches the desired pitch. In the alternative, the end of the cone portion 104 may be cut back an arbitrary amount and the fingers may be spread out or formed to match the desired pitch. The center finger 112 is affixed to the center conductor prior to cone attachment and has a profile at its distal end to match that of the outer fingers after cutting and forming.

The invention has been described showing, in all embodiments, a center signal carrying probe finger flanked by at lest two ground probe fingers. A possible, variation of the invention, however, would be to use but a single ground probe finger with a signal probe finger. For example, fewer ground probe fingers could be used with the embodiments of FIGS. 3, 5 and 6 as long as the shield was connected to the outer conductor of the coaxial cable.

In all three of the embodiments disclosed the shield member extends underneath the probe tip fingers between the fingers and the chuck holding the device under test. The shield therefore helps to block the generation of ground plane resonant modes that can otherwise interfere with and degrade the signal from the device under test.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A shielded microwave probe tip assembly comprising:

(a) a coaxial cable having an end and including an inner conductor, an outer conductor having a circumference and an inner dielectric;

(b) respective first and second conductive fingers connected to said inner conductor and said outer conductor, respectively, each finger including a cantilevered portion extending past said end of said cable and having tips at an outer end thereof, said cantilevered portions of said fingers being arranged in transversely spaced apart relationship to each other; and (c) a metallic shield coupled to at least one second conductive finger and extending from said end of said coaxial cable to a point near said tips of said first and second conductive fingers.

2. The shielded microwave probe tip assembly of claim 1 wherein said metallic shield includes a tapered cylindrical portion having an end electrically connected with said outer conductor over at least a portion of its circumference and tapering to a tip adjacent an end of said shield.

3. The shielded microwave probe tip of claim 2, further including a flat shelf provided on said cable by a semicylindrical recess formed on said cable adjacent said end and extending to said end, each finger including a supported portion connected along said flat shelf.

4. A shielded microwave probe tip assembly comprising:

(a) a supporting section of electromagnetic line including an inner conductor coaxially surrounded by an outer conductor;

(b) a tip section of said electromagnetic line having a top side and a bottom side and including a signal conductor and a pair of ground conductors generally arranged normally in parallel relationship with each other along a common plane so as to form a controlled impedance structure, said supporting section and said tip section being joined at a transition of said electromagnetic line so that said inner conductor is connected to said signal conductor and said outer conductor is connected to said pair of ground conductors;

(c) a shielding member interconnecting said pair of said ground conductors so as to cover at least a portion of said signal conductor on said bottom side of said tip section; and (d) said signal conductor and said ground conductors each having an end portion, said end portions being able to resiliently flex, despite said shielding member, relative to each other away from said common plane for probing of a device having nonplanar surfaces.

* * * * *